(12) United States Patent
Ashida

(10) Patent No.: US 8,222,059 B2
(45) Date of Patent: *Jul. 17, 2012

(54) METHOD TRANSPARENT MEMBER, OPTICAL DEVICE USING TRANSPARENT MEMBER AND METHOD OF MANUFACTURING OPTICAL DEVICE

(75) Inventor: Takeshi Ashida, Kyoto (JP)

(73) Assignee: Towa Corporation, Kyoto (JP)

( * ) Notice: Subject to any disclaimer, the term of this patent is extended or adjusted under 35 U.S.C. 154(b) by 32 days.

This patent is subject to a terminal disclaimer.

(21) Appl. No.: 12/163,669

(22) Filed: Jun. 27, 2008

(65) Prior Publication Data

US 2008/0265448 A1  Oct. 30, 2008

Related U.S. Application Data

(62) Division of application No. 11/243,967, filed on Oct. 6, 2005, now abandoned.

(30) Foreign Application Priority Data

Oct. 7, 2004  (JP) .................. 2004-294980

(51) Int. Cl.
    *H01L 21/00* (2006.01)
(52) U.S. Cl. ............... 438/28; 438/22; 438/26; 438/33; 438/34; 438/35; 438/110; 438/116
(58) Field of Classification Search .................. 438/22, 438/26, 28, 33–35, 110, 116
    See application file for complete search history.

(56) References Cited

U.S. PATENT DOCUMENTS 2,797,179 A   6/1957  Reynolds et al.
4,944,908 A   7/1990  Leveque et al.
5,147,821 A   9/1992  McShane et al.
5,169,677 A   12/1992 Sangyoji et al.
5,238,640 A   8/1993  Masui et al.
5,622,667 A   4/1997  Fujiyama et al.
5,635,115 A * 6/1997  Konishi et al. ............. 264/1.7

(Continued)

FOREIGN PATENT DOCUMENTS

EP   1396323 A1   3/2004

(Continued)

OTHER PUBLICATIONS

Translation of Japanese Patent Publication 04-348088 (Dec. 1992).

(Continued)

*Primary Examiner* — Bac Au

(74) *Attorney, Agent, or Firm* — Birch, Stewart, Kolasch & Birch, LLP

(57) ABSTRACT

In a method of manufacturing an optical device, a whole substrate is first prepared which has a plurality of regions corresponding to substrates constituting a plurality of optical devices, respectively. A plurality of chips are then mounted to the plurality of regions, respectively. A whole sealing member having a plurality of sealing members is integrally attached to the whole substrate to form an intermediate body. The intermediate body is divided into the above-described regions. Thus, the optical device having a substrate, a chip as an optical element mounted to the substrate and a sealing member with transparency provided at the substrate for the purpose of sealing the chip is manufactured. This manufacturing method improves the efficiency of manufacturing an optical device.

1 Claim, 5 Drawing Sheets

U.S. PATENT DOCUMENTS

| | | | |
|---|---|---|---|
| 5,725,891 | A | 3/1998 | Reid, Jr. |
| 5,744,087 | A | 4/1998 | Williams et al. |
| 5,776,514 | A | 7/1998 | Wu et al. |
| 5,783,220 | A | 7/1998 | Osada et al. |
| 5,830,402 | A | 11/1998 | Harada et al. |
| 5,846,477 | A | 12/1998 | Hotta et al. |
| 5,876,765 | A | 3/1999 | Hinterlechner |
| 5,942,168 | A | 8/1999 | Ichikawa et al. |
| 6,080,354 | A | 6/2000 | Miyajima |
| 6,344,162 | B1 | 2/2002 | Miyajima |
| 6,350,113 | B1 | 2/2002 | Miyajima |
| 6,478,562 | B1 | 11/2002 | Miyajima |
| 6,531,328 | B1 * | 3/2003 | Chen ............... 438/26 |
| 6,599,768 | B1 | 7/2003 | Chen |
| 6,630,374 | B2 | 10/2003 | Yamamoto |
| 6,652,799 | B2 | 11/2003 | Seng et al. |
| 6,734,571 | B2 | 5/2004 | Bolken |
| 6,743,389 | B2 | 6/2004 | Miyajima et al. |
| 6,764,290 | B2 | 7/2004 | Stangl et al. |
| 6,787,093 | B2 | 9/2004 | Kiritani |
| 6,881,611 | B1 | 4/2005 | Fukasawa et al. |
| 6,881,980 | B1 | 4/2005 | Ting et al. |
| 6,921,926 | B2 | 7/2005 | Hsu |
| 6,940,101 | B2 * | 9/2005 | Yano et al. ............... 257/98 |
| 6,949,772 | B2 * | 9/2005 | Shimizu et al. ............... 257/99 |
| 6,963,166 | B2 * | 11/2005 | Yano et al. ............... 313/498 |
| 6,977,188 | B2 | 12/2005 | Takase |
| 6,998,647 | B2 | 2/2006 | Morimoto et al. |
| 7,026,661 | B2 | 4/2006 | Murano |
| 7,056,770 | B2 | 6/2006 | Uragami et al. |
| 7,084,435 | B2 | 8/2006 | Sugimoto et al. |
| 7,095,053 | B2 | 8/2006 | Mazzochette et al. |
| 7,115,979 | B2 | 10/2006 | Park et al. |
| 7,128,562 | B2 | 10/2006 | Doi et al. |
| 7,452,737 | B2 * | 11/2008 | Basin et al. ............... 438/27 |
| 7,473,933 | B2 * | 1/2009 | Yan ............... 257/88 |
| 7,514,867 | B2 * | 4/2009 | Yano et al. ............... 313/512 |
| 2001/0008775 | A1 | 7/2001 | Yamamoto |
| 2002/0014693 | A1 | 2/2002 | Pollock |
| 2002/0094606 | A1 | 7/2002 | Fukutomi et al. |
| 2002/0123163 | A1 | 9/2002 | Fujii |
| 2002/0163006 | A1 * | 11/2002 | Yoganandan et al. ............ 257/81 |
| 2002/0187570 | A1 | 12/2002 | Fukasawa et al. |
| 2002/0195744 | A1 | 12/2002 | Otsuki et al. |
| 2003/0039717 | A1 | 2/2003 | Hwang et al. |
| 2003/0160256 | A1 * | 8/2003 | Durocher et al. ............... 257/88 |
| 2004/0009260 | A1 | 1/2004 | Gabriel |
| 2004/0048416 | A1 | 3/2004 | Takase |
| 2004/0051185 | A1 | 3/2004 | Konishi et al. |
| 2004/0063840 | A1 | 4/2004 | Starkey |
| 2004/0101631 | A1 | 5/2004 | Uragami et al. |
| 2004/0161489 | A1 | 8/2004 | Hwang et al. |
| 2004/0180459 | A1 * | 9/2004 | Hsu ............................. 438/26 |
| 2004/0219700 | A1 | 11/2004 | Silverbrook |
| 2005/0074912 | A1 * | 4/2005 | Yamauchi et al. ............... 438/26 |
| 2005/0074954 | A1 | 4/2005 | Yamanaka |
| 2005/0139846 | A1 | 6/2005 | Park et al. |
| 2005/0224830 | A1 * | 10/2005 | Blonder et al. ............... 257/100 |
| 2006/0186576 | A1 | 8/2006 | Takase et al. |
| 2007/0013090 | A1 | 1/2007 | Takase et al. |
| 2007/0132135 | A1 | 6/2007 | Takase et al. |
| 2007/0138696 | A1 | 6/2007 | Takase et al. |
| 2008/0164482 | A1 * | 7/2008 | Obara et al. ............... 257/88 |

FOREIGN PATENT DOCUMENTS

| | | |
|---|---|---|
| JP | 61-001067 A | 1/1986 |
| JP | 4-348088 A | 12/1992 |
| JP | 6-871 A | 1/1994 |
| JP | 2001-176902 A | 6/2001 |
| JP | 2001-203227 A | 7/2001 |
| JP | 2001-223285 A | 8/2001 |
| JP | 2002-36270 A | 2/2002 |
| JP | 2002-43345 A | 2/2002 |
| JP | 2002-314100 A | 10/2002 |
| JP | 2002-319711 A | 10/2002 |
| JP | 2002-368281 A | 12/2002 |
| JP | 2003-163382 A | 6/2003 |
| JP | 2003-324118 A | 11/2003 |
| JP | 2004-74461 A | 3/2004 |
| JP | 2004-88713 A | 3/2004 |
| JP | 2004-98364 A | 4/2004 |
| JP | 2004-148621 A | 5/2004 |
| JP | 2004-200269 A | 7/2004 |
| JP | 2004-216558 A | 8/2004 |
| JP | 2004-233482 A | 8/2004 |
| JP | 2004-330697 A | 11/2004 |
| WO | WO 2004/027880 A2 | 4/2004 |

OTHER PUBLICATIONS

Notice of Grounds of Rejection mailed Jan. 19, 2010 in Japanese Patent Application No. 095948/2007.

Notice of Grounds of Rejection mailed Jan. 19, 2010 in Japanese Patent Application No. 129395/2004.

Notice of Grounds of Rejection mailed Oct. 21, 2010 in Japanese Patent Application No. 294980/2004.

\* cited by examiner

METHOD TRANSPARENT MEMBER, OPTICAL DEVICE USING TRANSPARENT MEMBER AND METHOD OF MANUFACTURING OPTICAL DEVICE

This application is a Divisional of application Ser. No. 11/243,967, filed on Oct. 6, 2005, now abandoned the entire contents of which are hereby incorporated by reference and for which priority is claimed under 35 U.S.C. §120.

BACKGROUND OF THE INVENTION

1. Field of the Invention

The present invention relates to a transparent member used in an optical device having a chip as an optical element, an optical device using the transparent member, and a method of manufacturing the optical device.

2. Description of the Background Art

Referring to FIGS. 21 to 25, a first method of manufacturing a conventional optical device is described. Specifically, a method of manufacturing a package of a light-emitting diode (hereinafter referred to as an "LED") is described as an example of a manufacturing method of the optical device. For the sake of simplicity, respective drawings in association with the description below are schematically depicted and not drawn to scale.

In the method of manufacturing the conventional optical device, as shown in FIG. 21, an LED chip 3 is first die-bonded to a top surface 2 of a lead frame 1 as a substrate. Then, electrodes (not shown) of lead frame 1 and LED chip 3 are wire-bonded to each other via a wire 4.

Then, as shown in FIG. 22, for example by transfer molding, a protecting member 6 composed of a cured resin is formed at a prescribed region on top surface 2 excluding the region around LED chip 3 and wire 4 and at a prescribed region of a bottom surface 5. Protecting member 6 serves to protect LED chip 3 and wire 4, and in some cases, to reflect light emitted from LED chip 3 in an upward direction of the drawing. Furthermore, when forming protecting member 6, a concave portion 7 is formed in protecting member 6 on the side of top surface 2. The process described above provides a partially-completed product 8 corresponding to an LED package as one completed product. In this partially-completed product 8, a portion protruding from protecting member 6 in lead frame 1 functions as a lead of the LED package. It is to be noted that, in the state shown in FIG. 22, secondary molding may be performed, as necessary, to fill the space around LED chip 3 and wire 4 with a cured resin having transparency.

As shown in FIG. 23, an adhesive (not shown) is then applied to concave portion 7 of partially-completed product 8, and a transparent member composed of a material having transparency, that is, a lens member 9 is prepared. Lens member 9 is thereafter transported in a state held by adsorption and the like, and aligned with concave portion 7 of partially-completed product 8. Lens member 9 individually manufactured by injection molding, includes a transparent portion 10 having a configuration of a partial sphere and functioning as a convex lens, and a plate-like flange portion 11 extending laterally at the bottom of transparent portion 10, and has a circular shape in plan view.

As shown in FIG. 24, lens member 9 is then lowered to be placed on concave portion 7, and the adhesive cures to bond lens member 9 and partially-completed product 8 shown in FIG. 22. Thus, a partially-completed product with a lens 12 shown in FIGS. 24 and 25 is completed. Subsequent to the above-described process, the lead is subjected to bending, whereby an LED package is completed.

In addition to the above-described manufacturing method, the following second manufacturing method is also known, depending on the structure of the LED package. In the proposed manufacturing method, a layered ceramic substrate is used instead of lead frame 1, and a metal cap is attached to the top surface of the layered ceramic substrate instead of protecting member 6, and a lens (a transparent member) is attached to a hole portion provided in the top surface of the metal cap. This manufacturing method is disclosed, for example, in Japanese Patent Laying-Open No. 2003-163382. The lens used in this method is a convex lens having a circular shape in plan view and a convex cross-section at its center portion.

In a manufacturing method proposed as a third manufacturing method, a light-emitting diode pellet (an LED chip) on a lead frame is sealed with resin to form a photoelectric conversion substrate having a rectangular shape in plan view, onto which a transparent resin plate (a transparent member) is mounted. The transparent resin plate has a plate-like portion which is rectangular in plan view and a convex lens portion integrated. This manufacturing method is disclosed, for example, in Japanese Patent Laying-Open No. 4-348088. The transparent resin plate with a lens is molded by an injection molding method.

However, the conventional method set forth above poses the following problems. First, in the first and second manufacturing methods, the lens (including the lens member in the first manufacturing method) has a circular shape in plan view and a convex cross-section at the center portion. This makes it difficult to pick up the lens by gripping or adsorption and the like and to handle the lens during transportation even if the lens has a small area of a flange portion. In addition, if a jig for a handling operation contacts a portion through which light of the lens passes (transparent portion 10 in FIG. 25), the lens will be damaged. Also, management of inventory and processes become complicated because it is necessary to store, pick up and transport individual lenses in all of the first to third manufacturing methods. Furthermore, it is difficult to improve the efficiency of manufacturing LEDs because it is necessary to manufacture lenses and partially-completed products one by one and then attach one lens to one partially-completed product in all of the first to third manufacturing methods.

SUMMARY OF THE INVENTION

An object of the present invention is to provide a transparent member with improved production efficiency and quality, an optical device using the transparent member, and a method of manufacturing the optical device.

The transparent member of the present invention is, in an optical device having a substrate and a chip as an optical element mounted to the substrate, a transparent member used for the purpose of protecting the chip. The transparent member has a rectangular shape in plan view and is formed by dividing one integral molded body along phantom lines in a grid pattern. This structure allows a plurality of transparent members to be manufactured together, and therefore, increases the efficiency of manufacturing the transparent member. Furthermore, the transparent member has a rectangular shape in plan view so that it can be held by supporting its opposite sides. Therefore, errors occurring in handling of the transparent member and damages to it are prevented.

An optical device of one aspect of the present invention includes a substrate, a chip as an optical element mounted to the substrate, a protecting member provided on the substrate so as to surround the chip, and a transparent member attached to a top surface of the protecting member. Furthermore, the transparent member has a rectangular shape in plan view and is formed by dividing one integral molded body along phantom lines in a grid pattern. This structure can produce effects similar to those caused by the above-described transparent member.

In addition, the optical device of the above-described aspect may be formed by dividing an intermediate body along the phantom lines in a grid pattern. In this case, the intermediate body desirably includes a whole substrate having a plurality of regions corresponding to a plurality of substrates, a plurality of chips mounted to the plurality of regions, respectively, sectioned by the phantom lines in a grid pattern, a whole protecting member integrally provided on the whole substrate as well as having a plurality of protecting members corresponding to the plurality of regions, respectively, and one molded body attached to a top surface of the whole protecting member and having a plurality of transparent members.

An optical device of another aspect of the present invention includes a substrate, a chip as an optical element mounted to the substrate, and a sealing member with transparency provided at the substrate for the purpose of sealing the chip. In addition, the optical device is formed by dividing an intermediate body along phantom lines in a grid pattern. In this case, the intermediate body includes a whole substrate having a plurality of regions sectioned by the phantom lines in the grid pattern to correspond to the plurality of substrates, respectively, a plurality of chips mounted to the plurality of regions, respectively, and a whole sealing member having a plurality of sealing members corresponding to the plurality of regions, respectively, and integrally provided on the whole substrate. This structure also can improve the efficiency of manufacturing the optical device and facilitates handling of it.

The above-described optical device can be manufactured by the following manufacturing method.

A method of manufacturing an optical device of one aspect of the present invention includes the steps of mounting a chip as an optical element to a substrate, fixing a protecting member to the substrate so as to surround the chip, and attaching a transparent member to a top surface of the protecting member. The step of attaching the transparent member includes the steps of molding one molded body having a plurality of transparent members arranged at a plurality of regions, respectively, sectioned by phantom lines in a grid pattern, and dividing the one molded body along the phantom lines to form each of the plurality of transparent members.

Furthermore, the one molded body preferably includes a double-faced sheet having a base material, a temporary adhesive layer attached to one side of the base material and an actual adhesive layer attached to the other side of the base material and attached to the transparent member. In this case, the one molded body may be cut along the phantom lines with the temporary adhesive layer fixed to other members to form the plurality of transparent members, and after that, each of the plurality of transparent members may be removed from the base material. Then, the transparent member may be bonded to the top surface of the protecting member by the actual adhesive layer. This allows the manufacturing process to be simplified because it is not necessary to bond the transparent member to an opening using an adhesive.

A method of manufacturing an optical device of another aspect of the present invention is a method of manufacturing an optical device having a substrate, a chip as an optical element mounted to the substrate, a protecting member provided at the substrate so as to surround the chip, and a transparent member attached to a top surface of the protecting member. The manufacturing method includes the steps of preparing a whole substrate having a plurality of regions which can be sectioned by phantom lines in a grid pattern to correspond to a plurality of substrates, respectively, mounting a plurality of chips to the plurality of regions, respectively, integrally attaching a whole protecting member having a plurality of protecting members to the whole substrate, forming one intermediate body by attaching one molded body to a top surface of the whole protecting member, the one molded body having a plurality of transparent members arranged at the plurality of regions, respectively, sectioned by the phantom lines in the grid pattern, and dividing the one intermediate body along the phantom lines in the grid pattern to form a plurality of optical devices each having the substrate, the protecting member, the transparent member and the chip.

A method of manufacturing an optical device of still another aspect of the present invention is a method of manufacturing an optical device provided with a substrate, a chip as an optical element mounted to the substrate, and a sealing member with transparency provided at the substrate for the purpose of sealing the chip. The manufacturing method includes the steps of preparing a whole substrate having a plurality of regions which can be sectioned by phantom lines in a grid pattern to correspond to a plurality of substrates, respectively, mounting a plurality of chips to the plurality of regions, respectively, forming one intermediate body by integrally providing a whole sealing member having a plurality of sealing members at the whole substrate, and dividing the one intermediate body along the phantom lines in the grid pattern to form a plurality of optical devices each having the substrate, the sealing member and the chip.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
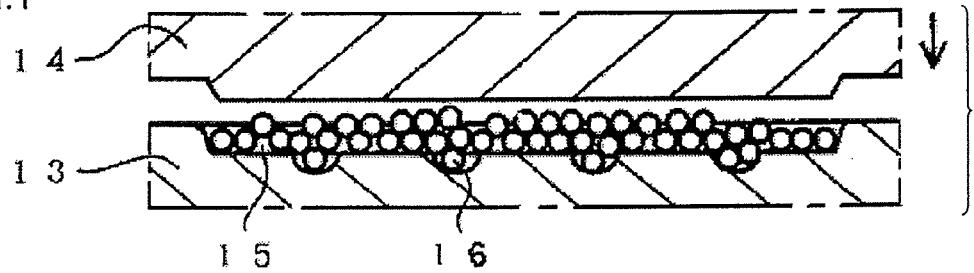
FIGS. 1-4 are partial sectional views for describing a method of manufacturing an optical device of the first embodiment.

First, referring to FIGS. 1 to 5, a transparent member, an optical device and a method of manufacturing the optical device according to a first embodiment of the present invention will be described. In each drawing described below, the same components as those in FIGS. 21 to 25 are designated by the same reference characters. Furthermore, in the following description, an LED chip is used as an example of an optical element, and an LED package is used as an example of an optical device. However, the optical element of the present invention is not limited to the LED chip, and may be a light-receiving element converting received light to an electrical signal, for example, a chip such as a photodiode (PD) or a solid-state image sensor. Also, the optical element of the present invention may be a light-emitting element emitting light depending on received electrical signals, for example, a chip such as a laser diode (LD). In addition, the optical device of the present invention may be a module used in optical communication. In other words, the present invention can be applied to any optical element.

In the present embodiment, a lens member, that is, a transparent member, which is bonded to a partially-completed product having a substrate, an LED chip and a protecting member (see a partially-completed product 8 shown in FIG. 23) is manufactured. The transparent member is formed by performing resin molding to integrally create a molded body including a plurality of lens members and then dividing the molded body.

According to the method of manufacturing the optical device of the present embodiment, a lower mold 13 and an upper mold 14 facing each other are first prepared, as shown in FIG. 1. Then, a prescribed amount of a granular resin material 16 composed of a thermosetting resin having transparency is supplied to a cavity 15 provided in lower mold 13. Cavity 15 has a plurality of concave portions in accordance with the shape of the lens member. Each of the plurality of concave portions is formed within a region sectioned by a phantom grid pattern. Also, resin material 16 may be in the form of powder, a mass or a sheet instead of a granule as shown, and may be a thermoplastic resin having prescribed transparency. A resin material which is liquid at room temperature may be injected into cavity 15.

Figure 2:
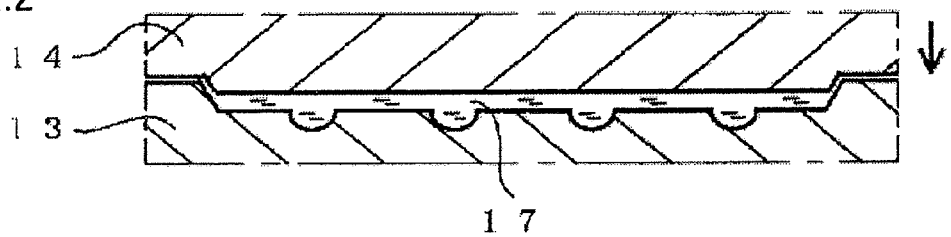
Figure 3:
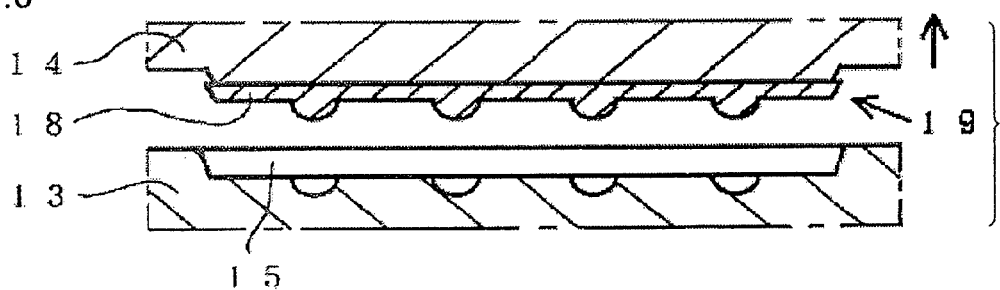

Then, as shown in FIG. 2, lowering upper mold 14 (see FIG. 1) causes lower mold 13 and upper mold 14 to be clamped together and resin material 16 to be pressed. Resin material 16 is subsequently heated by heaters (not shown) provided in lower mold 13 and upper mold 14, and melted. This causes a fluid resin 17 to be formed within cavity 15. Fluid resin 17 thereafter cures to form a molded body 19 composed of a cured resin 18, as shown in FIG. 3, that is, so-called compression molding is performed. Thus, molded body 19 including a plurality of lens members is molded integrally. Note that transfer molding may be carried out to integrally mold molded body 19.

As shown in FIG. 3, upper mold 14 is then raised to open lower mold 13 and upper mold 14. Molded body 19 is removed from cavity 15 and then transported to a cutting machine used in the next process while being held by means such as adsorption.

Then, molded body 19 is temporarily fixed to a stage 21 by a dicing sheet 20 having an appropriate tackiness, in other words, a low adhesive strength. Molded body 19 is thereafter cut by a rotary blade 22, that is, molded body 19 is divided, along phantom dicing lines 23 in a grid pattern extending toward a Y direction (the direction from the front to backward in FIG. 4) and an X direction (the direction from left to right in FIG. 4), respectively. As a result, a plurality of lens members 25 (see FIG. 5) are formed.

Figure 5:
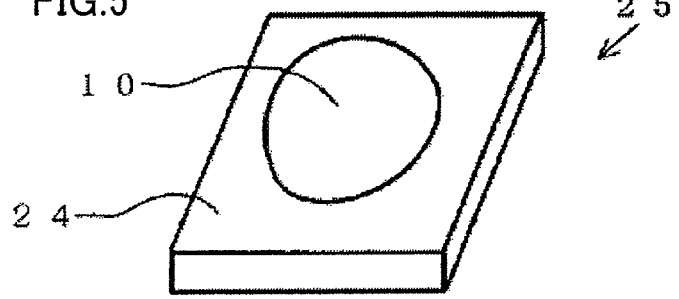
FIG. 5 is a perspective view of a completed lens member of the first embodiment.

It is noted that, as shown in FIG. 5, lens member 25 has a transparent portion 10 functioning as a transparent member, that is, a convex lens, and a plate-like flange portion 24 of a rectangular shape in plan view. This lens member 25 having the rectangular shape corresponds to the transparent member of the present invention. Each of the plurality of lens members 25 which remains temporarily fixed to dicing sheet 20 is then transported, stored and shipped.

Figure 23:
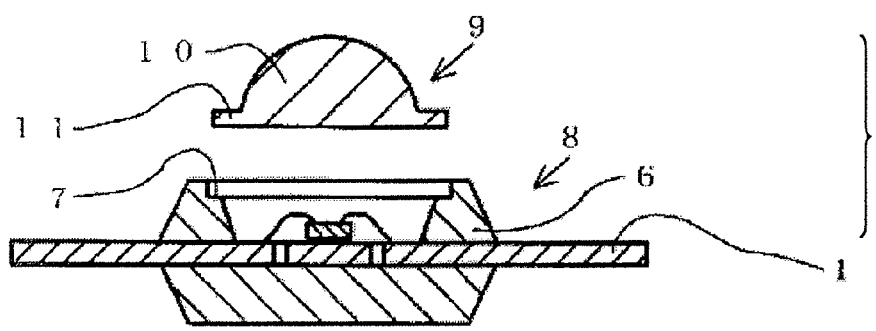

As in the case of the process shown in FIG. 23, an adhesive (not shown) is applied to a concave portion 7 of a partially-completed product 8. Lens member 25 is then detached from dicing sheet 20, held by adsorption and the like, transported and aligned with concave portion 7. It is assumed that, in the present embodiment, concave portion 7 shown in FIGS. 22 to 24 has a rectangular shape in plan view corresponding to flange portion 24 shown in FIG. 5.

Figure 24:
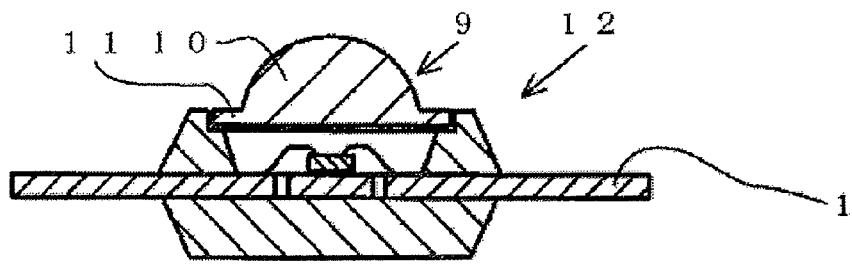
Figure 25:
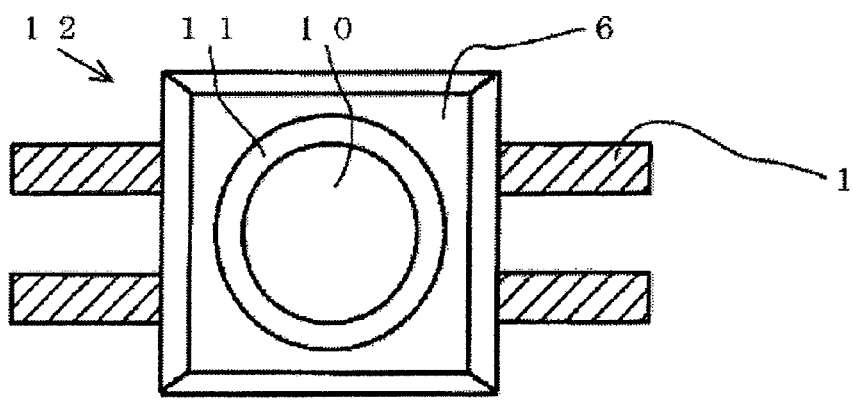
FIG. 25 is a plan view of a partially-completed product with a lens of the conventional optical device.

Then, as in the case of the process shown in FIG. 24, lens member 25 is lowered to be rested on concave portion 7, and the adhesive cures. Thus, a partially-completed product with a lens (see a partially-completed product with a lens 12 in FIGS. 24 and 25) is completed. After the above-described process, a lead is subjected to bending, whereby the optical device (an LED package) of the present embodiment is completed.

As described above, according to the present embodiment, after molded body 19 including the plurality of lens members 25 is molded integrally, it is divided into the plurality of lens members 25. Therefore, as compared to the case of forming the plurality of lens members 25 one by one by injection molding and the like, the efficiency of manufacturing the optical device is increased. Further, inventory management, storage and transportation and the like are simplified. Lens member 25 also has a wide plate-like flange portion 24 and a rectangular shape in plan view. Therefore, it is possible to grip and adsorb flange portion 24 when handling lens member 25. Furthermore, lens member 25 can be held by supporting its opposite sides even if flange portion 24 has a small area. Thus, errors occurring in handling lens member 25 and quality deterioration caused by damages to transparent portion 10 are prevented.

Note that, in the present embodiment, molded body 19 is cut by rotary blade 22. However, the method of cutting molded body 19 is not limited to the above-described method. Molded body 19 may have grooves formed corresponding to dicing lines 23, and may be bent to be divided along the grooves to form the plurality of lens members 25.

In addition, in the present embodiment, lens member 25 is used as a transparent member. However, the transparent member is not limited to the lens member and may be a lens member integrated with a barrel (a portion including a protecting member 6 and a lens member 9 on the top side of a substrate 1 in FIG. 23).

Second Embodiment

Referring to FIGS. 6 to 10, a transparent member, an optical device and a method of manufacturing the optical device according to a second embodiment of the present invention will be described. In the present embodiment, when a molded body is cut, it is temporarily fixed to a stage. In addition, each of a plurality of lens members formed by cutting the molded body is bonded to a corresponding partially-completed product. Also, by using a double-faced sheet, the molded body is temporarily fixed to the stage, and the lens member is bonded to the partially-completed product.

Figure 6:
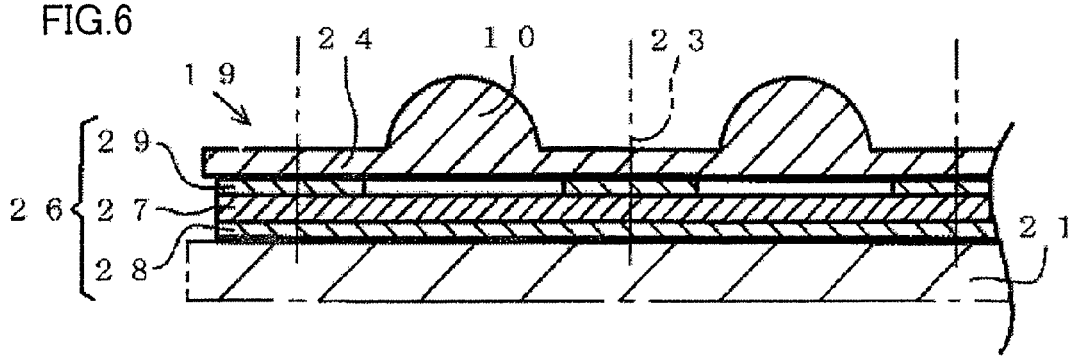
FIGS. 6-9 are partial sectional views for describing a method of manufacturing an optical device of the second embodiment.

In the method of manufacturing the optical device of the present embodiment, as shown in FIG. 6, a double-faced sheet 26 is first affixed to the bottom side of a molded body 19. Double-faced sheet 26 has a three-layer structure which is constituted of a base material 27, a temporary adhesive layer 28 for temporary fixing which is formed on one side (the bottom side in FIG. 6) of base material 27 and has a low adhesive strength, and an actual adhesive layer 29 for actual fixing which is formed on the other side (the top side in FIG. 6) of base material 27 and has a high adhesive strength. Actual adhesive layer 29 is affixed to the bottom side of molded body 19. Furthermore, actual adhesive layer 29 corresponding to one lens member 25 is patterned so as to be located underneath a flange portion 24 but not underneath a transparent portion 10. Note that when an acrylic-like transparent member, for example, is used as actual adhesive layer 29, actual adhesive layer 29 may be provided across the entire bottom side of lens member 25.

Figure 4:
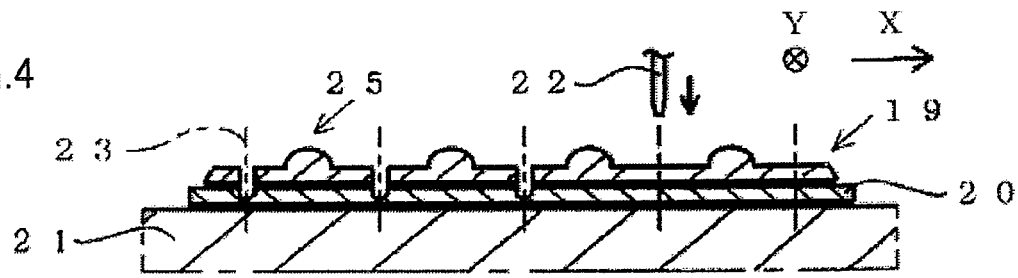

Double-faced sheet 26 is then used in place of dicing sheet 20 shown in FIG. 4 to temporarily fix molded body 19 to a stage 21 by temporary adhesive layer 28. Molded body 19 is thereafter cut by a rotary blade 22 along dicing lines 23 in a grid pattern to thereby form a plurality of lens members 25. At this time, each of the plurality of lens members 25 is rectangular in plan view and is provided with double-faced sheet 26.

Figure 7:
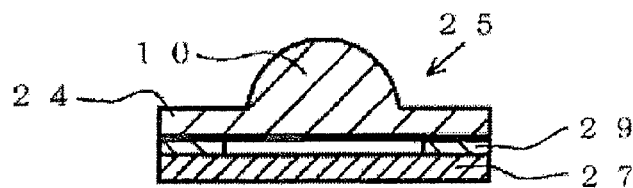

The plurality of lens members 25 are then stripped off from temporary adhesive layer 28 on stage 21. Thus, as shown in FIG. 7, lens member 25 is formed in which actual adhesive layer 29 and base material 27 are affixed in this order to the bottom side of lens member 25.

Figure 8:
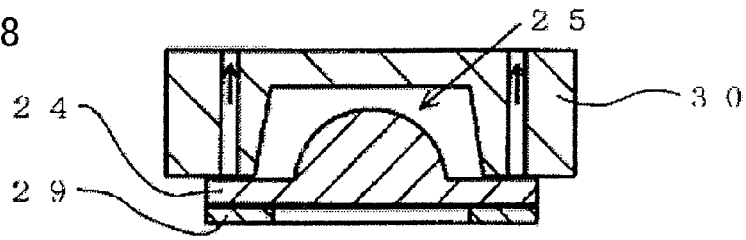
Figure 9:
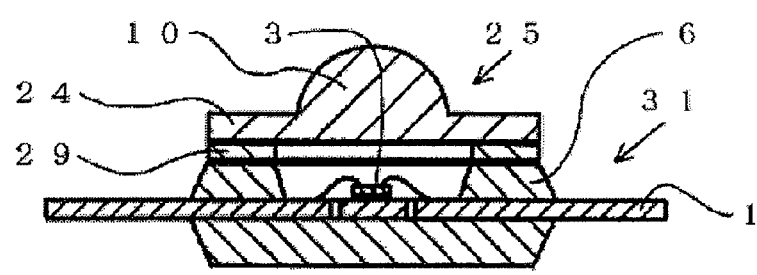
Figure 10:
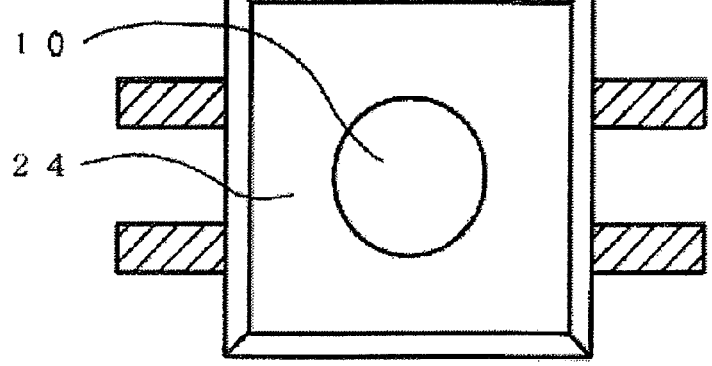
FIG. 10 is a plan view of a partially-completed product with a lens of the optical device of the second embodiment.

After stripping base material 27 from actual adhesive layer 29, as shown in FIG. 8, lens member 25 is transported with flange portion 24 adsorbed by an adsorption holder 30. As shown in FIGS. 9 and 10, lens member 25 is thereafter aligned with a partially-completed product 31, and lowered to contact the top side of partially-completed product 31, and then pressurized to bond lens member 25 on the top side of partially-completed product 31. In other words, lens member 25 is attached to an opening of a protecting member 6 surrounding a chip 3. A lead is then subjected to bending, whereby the optical device (an LED package) of the present embodiment is completed.

As described above, in the present embodiment, one double-faced sheet 26 is used which functions as temporary fixing means used in cutting molded body 19 and actual fixing means for bonding each of the plurality of lens members 25 to a corresponding partially-completed product 31. The plurality of lens members 25 are formed by cutting molded body 19. Thus, it is possible to eliminate the process of applying an adhesive to partially-completed product 31, and therefore, the efficiency of manufacturing the optical device can be improved.

Third Embodiment

Figure 11:
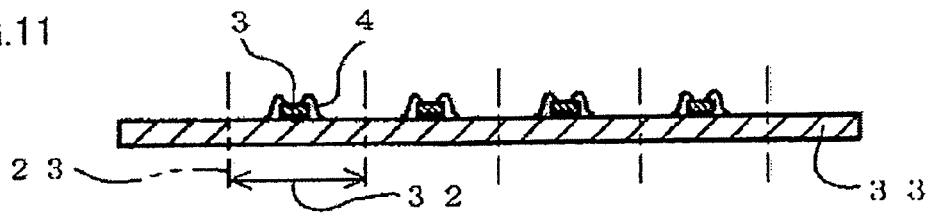
FIGS. 11-14 are partial sectional views for describing a method of manufacturing an optical device of the third embodiment.

Then, referring to FIGS. 11 to 15, a transparent member, an optical device and a method of manufacturing the optical device according to a third embodiment of the present invention will be described. In the method of manufacturing the optical device of the present embodiment, as shown in FIG. 11, a whole substrate 33 is first prepared in which a plurality of regions 32 sectioned by phantom lines in a grid pattern and corresponding to optical devices, respectively, are formed. Note that whole substrate 33 includes a printed board and the like. Chips 3 are then die-bonded to regions 32 each having a rectangular shape in plan view, respectively, and electrodes (not shown) of chip 3 and whole substrate 33 are wire-bonded to each other by a wire 4.

Figure 12:
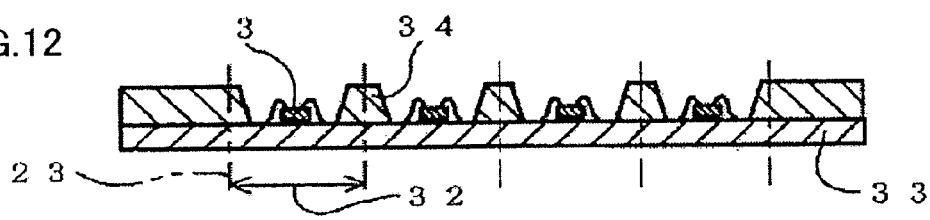

Then, as shown in FIG. 12, a whole protecting member 34 surrounding a chip in each of the plurality of regions 32 is integrally formed by transfer molding. Note that, in place of this process, whole protecting member 34 may be integrally pre-molded separately from whole substrate 33 and then be aligned with whole substrate 33 to be bonded to it. Using these methods, whole protecting member 34 may be integrally provided at whole substrate 33.

Figure 13:
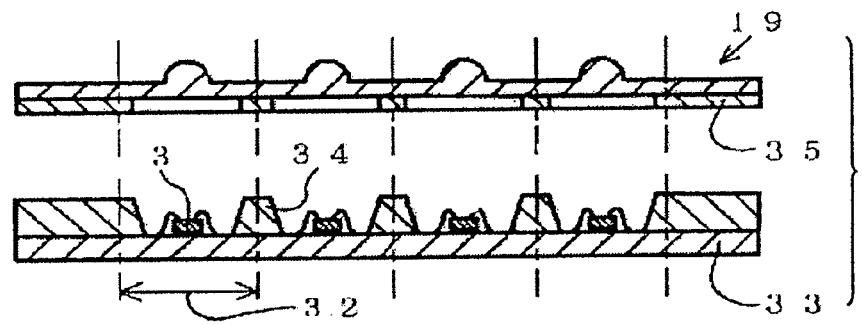

As shown in FIG. 13, a molded body 19 is then prepared (see FIG. 3). Molded body 19 is integrally molded by a transparent resin. It is preferable that an adhesive sheet 35 is previously affixed to the bottom side of molded body 19. Adhesive sheet 35 has functions similar to those of actual adhesive layer 29 shown in FIGS. 6 to 9. Furthermore, molded body 19 is aligned with whole substrate 33 and then lowered to be pressed on a top surface (the top side in FIG. 13) of whole protecting member 34. In other words, molded body 19 is attached such that it blocks an opening of whole protecting member 34 provided to surround chip 3. Thus, attachment is established between molded body 19 and whole protecting member 34.

Figure 14:
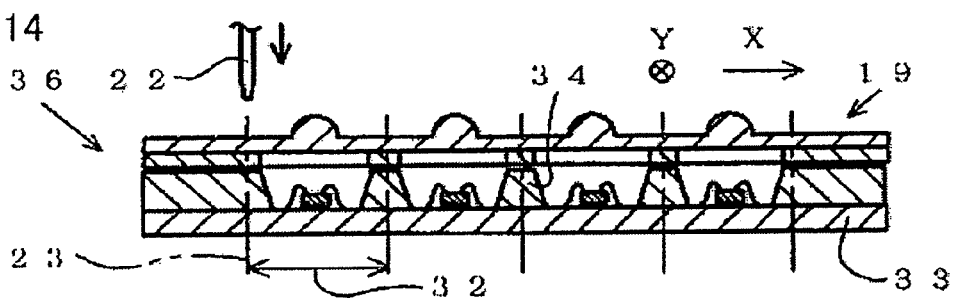

As shown in FIG. 14, an intermediate body 36 having molded body 19 and whole protecting member 34 bonded is temporarily fixed to a stage (not shown). Intermediate body 36 is then cut by a rotary blade 22 along phantom dicing lines 23 in a grid pattern extending toward a Y direction (the direction from the front to backward in the drawing) and an X direction (the direction from left to right in the drawing), respectively. Thus, intermediate body 36 is divided into regions 32 to form a plurality of optical devices 37 (an LED package) shown in FIG. 15.

Optical device 37 has a substrate 38 which is a division of whole substrate 33, a chip 3 mounted on the top side of substrate 38, a protecting member 39 provided to surround chip 3, and a lens member 25 which is a transparent member mounted on the top side of protecting member 39 to block its opening. In addition, optical device 37 is electrically connected to another printed board (not shown) or the like by an external electrode (not shown) provided on the bottom side of substrate 38.

As described above, according to the method of manufacturing the optical device of the present embodiment, whole protecting member 34 surrounding chip 3 mounted to each region 32 of whole substrate 33 is integrally molded. Also, integral molded body 19 having transparency is bonded on whole protecting member 34 to form intermediate body 36. Furthermore, intermediate body 36 is divided into regions 32 to complete optical device 37. Therefore, as compared to a conventional manufacturing method of bonding one lens member to one partially-completed product (see FIGS. 21 to 25), the above-described manufacturing method considerably improves the efficiency of manufacturing the optical device. In addition, lens member 25 constituting optical device 37 is treated integrally as molded body 19 until intermediate body 36 is cut. Thus, a plurality of lens members 25 can be integrally held by gripping and adsorbing a portion (a peripheral portion) not corresponding to lens member 25 of molded body 19. Therefore, errors occurring in handling molded body 19 and quality deterioration of the optical device caused by damages to lens member 25 are prevented. Optical device 37 also has a rectangular shape in plan view so that it can be held by supporting its opposite sides. Therefore, handling of optical device 37 is facilitated and damage to lens member 25 is prevented.

Fourth Embodiment

Figure 16:
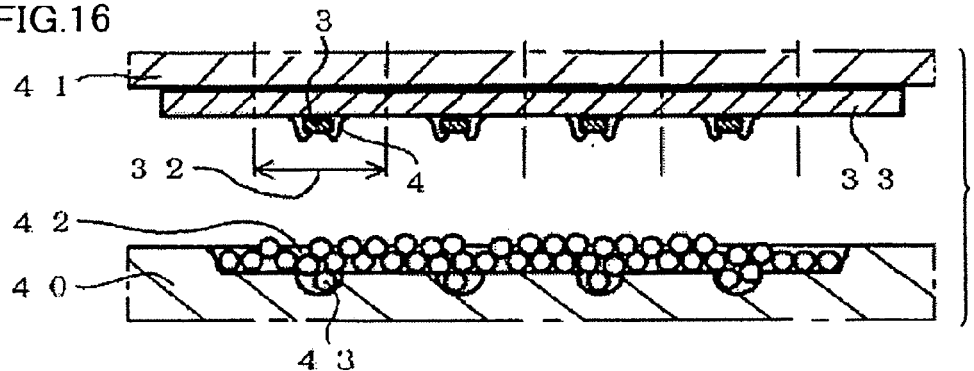
FIGS. 16-19 are partial sectional views for describing a method of manufacturing an optical device of the fourth embodiment.

Referring to FIGS. 16 to 20, a transparent member, an optical device and a method of manufacturing the optical device according to a fourth embodiment of the present invention will be described. In the method of manufacturing the optical device of the present embodiment, as described using FIG. 11, a plurality of chips 3 are die-bonded to a plurality of regions 32 of a whole substrate 33, respectively, and electrodes (not shown) of chips 3 and whole substrate 33 are wire-bonded to each other by a wire 4. A lower mold 40 and an upper mold 41 facing each other are then prepared. Note that a cavity 42 is formed in lower mold 40 and, in cavity 42, a plurality of concave portions corresponding to a plurality of chips 3, respectively, are formed within the plurality of regions sectioned by phantom lines in a grid pattern. Whole substrate 33 is also fixed to upper mold 41 by means of adsorption and the like, as shown in FIG. 16. In addition, as described using FIG. 1, a prescribed amount of a granular resin material 43 formed of thermosetting resin having transparency is supplied to cavity 42.

Figure 17:
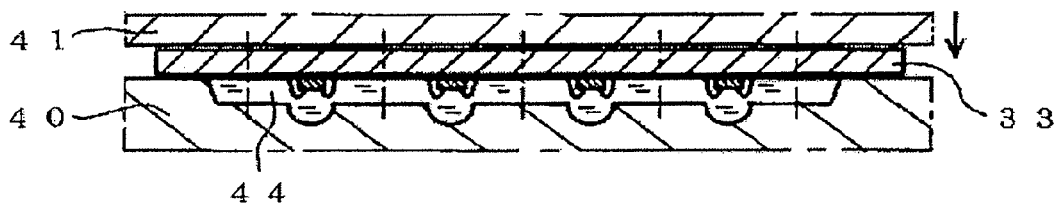

As shown in FIG. 17, resin material 43 is heated and melted to form a fluid resin 44 within a cavity 15, and lower mold 40 and upper mold 41 are thereafter clamped together. Then, a heater (not shown) provided in lower mold 40 is used to heat resin material 43. In place of or in addition to the heater, a contact type heating plate and/or non-contact type halogen lamp and the like may be also inserted between lower mold 40 and upper mold 41. As a result of the above-described process, an intermediate body 46 having a molded body 45 is formed (see FIG. 18). Molded body 45 is composed of a cured resin created by curing fluid resin 44. Intermediate body 46 has whole substrate 33 and molded body 45.

Figure 18:
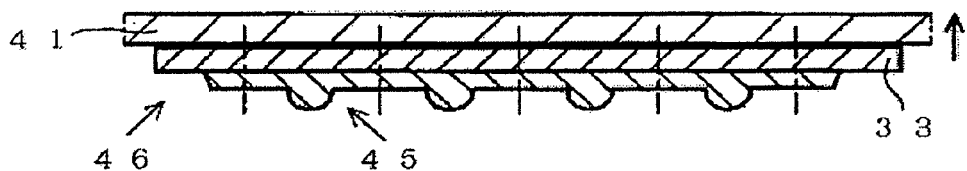

As shown in FIG. 18, upper mold 41 is then raised to open the lower mold (not shown) and upper mold 41. Molded body 45 functions as a whole sealing member which integrally seals all of a plurality of chips 3 on whole substrate 33. In the above-described process, in short, compression molding is carried out to integrally mold intermediate body 46. Note that a cured resin may be formed by transfer molding in place of compression molding to integrally mold intermediated body 46.

Figure 19:
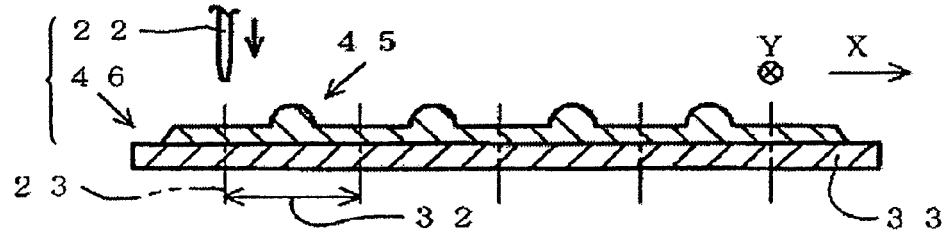

As shown in FIG. 19, intermediate body 46 is then temporarily fixed to a stage (not shown). Intermediate body 46 is then cut by a rotary blade 22 along phantom dicing lines 23 in a grid pattern extending toward a Y direction (the direction from the front to backward in the drawing) and an X direction (the direction from left to right in the drawing), respectively. Thus, intermediate body 46 is divided into regions 32 to form a plurality of optical devices 47 shown in FIG. 20.

Figure 20:
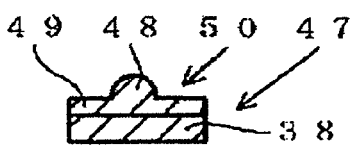
FIG. 20 is a cross sectional view of a completed optical device of the fourth embodiment.
Figure 21:
FIGS. 21-24 are cross sectional views of a method of manufacturing a conventional optical device.
Figure 22:
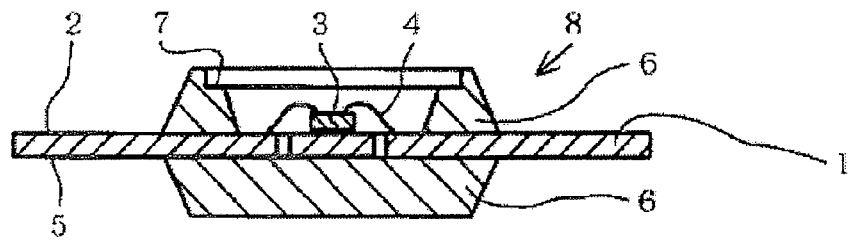

By carrying out the above-described process, optical device 47 (an LED package) of the present embodiment shown in FIG. 20 is completed. This optical device 47 has a substrate 38 divided from whole substrate 33, a chip (not shown) mounted on the top side of substrate 38, a transparent member, that is, a lens member 50 having a transparent portion 48 in the form of a convex lens and a plate-like flange portion 49 and sealing the chip.

As described above, in the present embodiment, chips 3 mounted to regions 32 in whole substrate 33, respectively, are integrally sealed to mold intermediate body 46. Intermediate body 46 is then divided into regions 32 to form the plurality of optical devices 47. Therefore, as compared to the conventional manufacturing method of bonding one lens member to one partially-completed product (see FIGS. 21 to 25), the efficiency of manufacturing the optical device is further improved. As compared to the manufacturing method of forming the protecting member of the third embodiment (FIGS. 16 to 20), the production efficiency is also improved. In addition, intermediate body 46 can be held by gripping and adsorbing a portion not corresponding to lens member 50 of intermediate body 46 (a peripheral portion in molded body 45). Therefore, errors occurring in handling intermediate body 46 and quality deterioration of the optical device caused by damages to lens member 50 are prevented. Furthermore, optical device 47 has a rectangular shape in plan view so that it can be held by supporting its opposite sides to facilitate handling of optical device 47 and to prevent damages to lens member 50.

Figure 15:
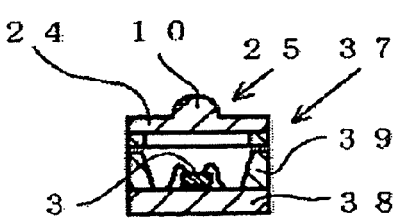
FIG. 15 is a cross sectional view of a completed optical device of the third embodiment.

Note that the present embodiment employs a method in which intermediate body 46 having whole substrate 33 and molded body 45 is molded integrally. However, instead of using the above-described method, a member as an alternative to a portion composed of a cured resin may be integrally pre-molded by a transparent resin, and the molded member may be used as a whole sealing member. In this case, the whole sealing member is first integrally pre-molded separately from whole substrate 33. Specifically, a portion of molded body 45 other than a prescribed space around LED chip 3 and wire 4, in other words, a portion corresponding to molded body 19 and whole protecting member 34 shown in FIG. 4, is integrally molded as a whole sealing member. The whole sealing member is aligned with whole substrate 33 and bonded to it. Thus, the whole sealing member functioning as a protecting member and a lens member is integrally provided on whole substrate 33 to form an intermediate body. The intermediate body is then divided into regions 32 to form a plurality of optical devices. As a result, each of the plurality of optical devices has a structure in which lens member 25 and protecting member 39 shown in FIG. 15 are integrated and composed of a transparent resin.

It is noted that, in each of the first to fourth embodiments, lens members 25 and 50 have transparent portions 10 and 48 in the form of a convex lens and plate-like flange portions 24 and 49, respectively. However, the present invention is not limited to the above-described structure, and may be formed such that lens members 25 and 50 are in their entirety to be a transparent portion in the form of a convex lens. In this case, lens members 25 and 50 or optical devices 37 and 47 can be held by supporting the opposite sides, that is, portions other than the transparent portion in the form of a convex lens while a dicing sheet (see dicing sheet 20 in FIG. 4) is expanded after having been cut. This prevents errors occurring in handling lens members 25 and 50 and optical devices 37 and 47, as well as quality deterioration.

Furthermore, wire-bonding is used to electrically connect electrodes of a chip and a substrate. However, other connecting methods may be used in place of the above-described structure. For example, a chip may be flip-chip bonded so that light is emitted from a light-emitting element or incident on a light-receiving element via an opening provided at the substrate.

In addition, in the present embodiment, a rotary blade 22 cuts molded body 19, and intermediate bodies 36 and 46. However, the present invention is not limited to this, and can employ means of cutting (trimming) by a laser beam as well as cutting by a wire saw and the like.

Lens member 25 of the present embodiment is placed such that its convex portion is directed toward the outer side of the optical device. However, lens member 25 of the present invention is not limited to this and may be placed such that its convex portion is directed toward the interior of the optical device. In addition, lens member 25 may have a convex shape protruding from the main surfaces of both sides of the optical device, and a shape having a transparent portion in the form of a convex lens and a light reflecting wall provided therearound. These are also applied to molded body 19 of the third embodiment and the whole sealing member described in the fourth embodiment.

For example, if a lens member is not required as in a certain type of a light-receiving element and the like, a plate-like member can be used as a transparent member. Also, after a plate-like molded body is integrally molded and bonded to a whole protecting member to form an intermediate body, the intermediate body may be divided to form a plurality of optical devices (see FIGS. 13 and 14). Furthermore, a plate-like member may be provided in place of lens member 50 shown in FIGS. 16 to 20. In these cases, the plate-like member is equivalent to the transparent member according to the present invention.

The present invention may be also applied to any optical device provided with a light-receiving element or both of a light-emitting element and a light-receiving element.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of an optical device comprising:
　a substrate having a flat main surface;
　a chip as an optical element mounted to said flat main surface of said substrate; and
　a sealing member with transparency provided at said substrate for the purpose of sealing said chip, wherein
said optical device is formed by dividing an intermediate body along phantom lines in a grid pattern, and wherein
a method of forming said intermediate body comprises
preparing a whole substrate on which a plurality of chips are respectively attached to a plurality of regions sectioned by the phantom lines in said grid pattern,
integrally providing on said whole substrate a whole sealing member having a plurality of sealing members respectively corresponding to said plurality of regions, wherein
said plurality of sealing members fills a plurality of prescribed spaces, each of which including said chip in each of said plurality of regions, respectively,
said plurality of prescribed spaces are provided on a lower mold,
said plurality of chips moves towards said plurality of prescribed spaces, respectively, with said substrate attached to an upper mold opposing said lower mold,
said plurality of sealing members are formed by curing a resin material in a state where the plurality of chips are immersed within a resin material melted by heating, filling said prescribed spaces, or within a resin material retaining a liquid state at a room temperature filling said prescribed spaces, and the upper mold and the lower mold are respectively positioned to allow a layer of the resin material having a thickness between the prescribed spaces of the lower mold;
said plurality of sealing members are formed by compression molding, and
said plurality of sealing members are connected to each other by a plate-like flange portion formed from curing of the layer of the resin material having the thickness.

\* \* \* \* \*